United States Patent
Nishida et al.

(10) Patent No.: US 6,602,767 B2
(45) Date of Patent: Aug. 5, 2003

(54) METHOD FOR TRANSFERRING POROUS LAYER, METHOD FOR MAKING SEMICONDUCTOR DEVICES, AND METHOD FOR MAKING SOLAR BATTERY

(75) Inventors: Shoji Nishida, Kanagawa (JP); Katsumi Nakagawa, Kanagawa (JP); Takao Yonehara, Kanagawa (JP); Kiyofumi Sakaguchi, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/769,329

(22) Filed: Jan. 26, 2001

(65) Prior Publication Data

US 2001/0041423 A1 Nov. 15, 2001

(30) Foreign Application Priority Data

Jan. 27, 2000 (JP) .................................. 2000-018797
Dec. 6, 2000 (JP) .................................. 2000-371352

(51) Int. Cl.[7] ........................ H01L 21/20; H01L 21/36
(52) U.S. Cl. ................................ 438/507; 438/67
(58) Field of Search ............... 438/22, 48, 57, 438/64, 67, 455, 458, 497, 507, 977, 478, 501

(56) References Cited

U.S. PATENT DOCUMENTS

| 4,816,420 | A | 3/1989 | Bozler et al. .................. 437/2 |
| 5,854,123 | A | 12/1998 | Sato et al. .................. 438/507 |
| 5,856,229 | A | 1/1999 | Sakaguchi et al. .......... 438/406 |
| 6,100,165 | A | 8/2000 | Sakaguchi et al. .......... 438/455 |
| 6,100,166 | A * | 8/2000 | Sakaguchi et al. .......... 438/455 |
| 6,133,112 | A | 10/2000 | Iwane et al. ................. 438/409 |
| 6,190,937 | B1 * | 2/2001 | Nakagawa et al. ........... 438/67 |
| 6,258,698 | B1 * | 7/2001 | Iwasaki et al. .............. 438/455 |
| 6,429,035 | B2 * | 8/2002 | Nakagawa et al. ........... 438/57 |

FOREIGN PATENT DOCUMENTS

| JP | 6045622 | 2/1994 |
| JP | 9036403 | 2/1997 |

OTHER PUBLICATIONS

Milnes, A.G. and Feucht, D.L., "Peeled Film Technology Solar Cells", IEEE Photovoltaic Specialists Conference, p. 338, 1975.

\* cited by examiner

*Primary Examiner*—David Nelms
*Assistant Examiner*—Phuc T. Dang
(74) *Attorney, Agent, or Firm*—Fitzpatrick, Cella, Harper & Scinto (57) ABSTRACT

A method for transferring a porous layer includes forming a porous layer on one side of a crystalline silicon member by anodization, fixing a supporting substrate onto the surface of the porous layer, and applying force to any one of the supporting substrate and the porous layer, whereby at least part of the porous layer is cleaved from the crystalline silicon member and is transferred onto the supporting substrate. The crystalline silicon member can be recycled and this method is suitable for mass production of semiconductor devices or solar batteries at low cost.

21 Claims, 4 Drawing Sheets

METHOD FOR TRANSFERRING POROUS LAYER, METHOD FOR MAKING SEMICONDUCTOR DEVICES, AND METHOD FOR MAKING SOLAR BATTERY

BACKGROUND OF THE INVENTION

1. Field of the Invention

The present invention relates to a method for transferring a porous layer, to a method for making a semiconductor device, and to a method for making a solar battery. In particular, the present invention relates to a method for forming a porous layer on an inexpensive substrate and to a method for making semiconductor devices, such as a solar battery, by depositing crystalline thin-films on an inexpensive substrate with a porous layer provided therebetween.

2. Description of the Related Art

Solar batteries have been widely studied as driving energy sources for various devices and as electric power sources which are connected to commercial power systems.

Low-cost production of solar batteries requires forming semiconductor devices on an inexpensive substrate. A typical semiconductor material for solar batteries is silicon. In particular, single-crystal silicon is most advantageous in view of photoelectric conversion efficiency which is an efficiency for converting optical energy into electromotive force. On the other hand, amorphous silicon is advantageous in view of production using a large substrate at low cost. In recent years, the use of polycrystalline silicon has been examined in order to achieve a low cost comparable to that of amorphous silicon and a high energy conversion efficiency comparable to that of single-crystal silicon.

Since conventional methods for making solar batteries using single-crystal silicon or polycrystalline silicon use platelet substrates which are formed by slicing a crystal ingot, it is difficult to decrease the thickness to 0.3 mm or less. Since such substrates are larger than a thickness (approximately 20 $\mu$m to 50 $\mu$m) which is required for sufficiently absorbing light, the substrate material is not effectively used. Accordingly, low-cost production of solar batteries requires development of thinner single-crystal silicon or polycrystalline silicon substrates.

In recent years, a method for making a silicon sheet by a spinning process has been proposed in which melted silicon droplets are cast into a mold. The thickness of the crystal silicon substrate prepared by this method reaches approximately 0.1 mm to 0.2 mm at minimum, and is still larger than the above thickness (approximately 20 $\mu$m to 50 $\mu$m) which is required for sufficiently absorbing light.

An attempt to accomplish both a high energy conversion efficiency and a low production cost is proposed by using an epitaxial thin-layer which is deposited on a single-crystal silicon substrate and is cleaved from the substrate as solar batteries (Milnes, A. G. and Feucht, D. L., "Peeled Film Technology Solar Cells", IEEE Photovoltaic Specialist Conference, p. 338, 1975).

In this method, however, a SiGe interlayer is provided on a single-crystal silicon substrate, a single-crystal silicon layer is heteroepitaxially deposited on the interlayer, and the interlayer is selectively melted to cleave the heteroepitaxially deposited single-crystal silicon layer. In general, defects readily occur at the interface between the underlayer and the heteroepitaxially deposited layer, since these layers have different lattice constants. Moreover, this method is not always advantageous in view of material cost since the method uses different materials.

U.S. Pat. No. 4,816,420 discloses a thin crystalline solar battery which is produced by a method including forming a crystalline sheet by selective epitaxial growth through a mask and then lateral crystal growth on a crystal substrate and cleaving the sheet from the substrate.

In this method, the mask has slits as line seeds, and a crystal sheet, which is formed by selective epitaxy from the slits and then lateral growing, is cleaved. That is, the crystal sheet is mechanically cleaved by means of crystal cleavage. When the line seeds have a size greater than a certain size, the crystal has a large contact area with the substrate, and the crystal sheet may be damaged during the cleaving process. In the production of solar batteries having a large area, the slit length may be several millimeters to several centimeters no matter how much the slit width is decreased (in practice, the slit width may be reduced to approximately 1 $\mu$m). Thus, this method is not practical.

In consideration of such problems, Japanese Unexamined Patent Application Publication No. 6-45622 discloses a method for making a crystalline thin-film solar battery having satisfactory characteristics. In this method, a porous silicon layer is formed on a silicon wafer by anodization and is then cleaved from the wafer. The cleaved porous silicon layer is bonded onto a metal substrate and an epitaxial layer is deposited thereon. This product is used as the solar battery.

In this method, however, the metal substrate is exposed in a high-temperature process. Such a process may causes inclusion of impurities in the epitaxial layer, resulting in deterioration of properties as the epitaxial layer. Moreover, a significantly thin porous layer is handled alone in this process. Thus, particular attention must be directed to transportation of the thin porous layer.

SUMMARY OF THE INVENTION

Accordingly, it is an object of the present invention to provide a method for transferring a porous layer which produces a semiconductor layer having satisfactory characteristics.

It is another object of the present invention to provide a method suitable for mass production of semiconductor devices having satisfactory characteristics.

It is still another object of the present invention to provide a method suitable for mass production of high-efficiency solar batteries.

It is a further object of the present invention to reuse a crystal substrate which was used for forming a porous layer thereon, after the substrate was separated therefrom, in order to reduce production costs.

An aspect of the present invention relates to a method for transferring a porous layer including an anodization step of forming by anodization a porous layer on one side of a crystalline silicon member, a fixing step of fixing a supporting substrate onto the surface of the porous layer, and a cleaving step of applying force to any one of the supporting substrate and the porous layer, whereby at least part of the porous layer is cleaved from the crystalline silicon member and is transferred onto the supporting substrate.

Other aspects of the present invention relate to methods for making a semiconductor device and a solar battery including the above steps for transferring the porous layer onto the supporting substrate and a step of forming a crystalline semiconductor layer onto the transferred porous layer.

The terms "at least part of the porous layer is cleaved" mean that the porous layer is cleaved at an interface between the porous layer and the other layer of the crystalline silicon member, that part of the porous layer is cleaved so that the porous layer remains on the crystalline silicon substrate. That is, the entire porous layer and the unanodized portion are separated from each other at the interface therebetween, or part of the porous layer and the unanodized portion are separated from each other at the interior of the porous layer.

The crystalline silicon member includes a substrate, a film, and the like.

In these methods, another porous layer is preferably formed by anodization onto the crystalline silicon after the prior porous layer is transferred. Moreover, the other porous layer is preferably transferred onto another supporting substrate which is different from the prior supporting substrate.

Further objects, features and advantages of the present invention will become apparent from the following description of the preferred embodiments with reference to the attached drawings.

DESCRIPTION OF THE PREFERRED EMBODIMENTS

FIGS. 1A to 1G are schematic cross-sectional views illustrating a preferred embodiment of a production process for a solar battery of the present invention. The process will be described below.

Figure 1A:
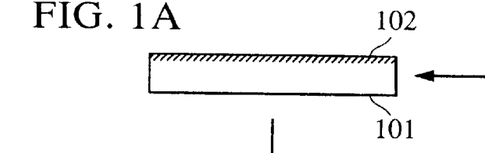
FIGS. 1A to 1G are schematic cross-sectional views illustrating an embodiment of a method for making a solar battery of the present invention.
Figure 1B:
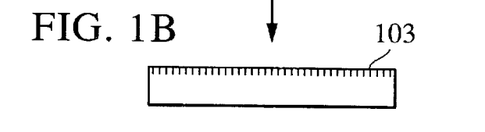
Figure 1C:
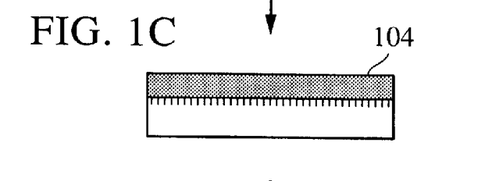
Figure 1D:
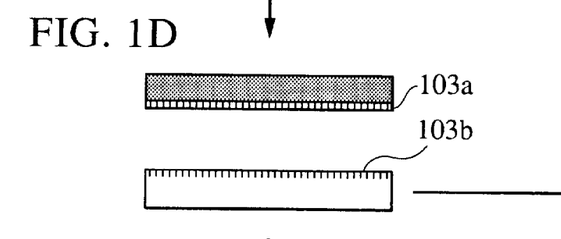
Figure 1E:
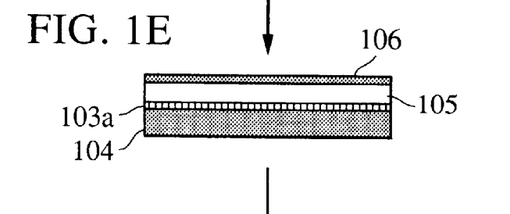
Figure 1F:
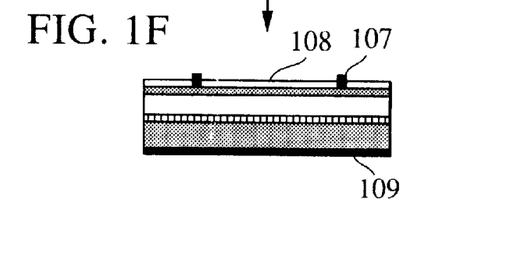
Figure 1G:
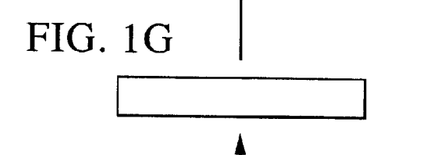

With reference to FIG. 1A, a $p^+$ (or $n^+$) layer 102 is formed onto a crystal substrate 101 composed of crystalline silicon, e.g., a single-crystal silicon wafer, by thermal diffusion or ion implanting of a dopant or by incorporating a dopant into the wafer in a wafer production process. With reference to FIG. 1B, the doped wafer surface is anodized in a HF solution to form a porous layer 103. When the anodization current is varied from a lower level to a higher level in the midway of the anodization process, the porous layer 103 has a gradient of porosity in the thickness direction, and the porous layer 103 will be readily cleaved later. For example, the porosity is increased at the lower side near the crystal substrate 101 of the porous layer 103 so that this portion becomes relatively fragile. Such a configuration facilitates transfer of major portions of the porous layer 103 in the subsequent transfer step. With reference to FIG. 1C, a supporting substrate 104, for example, a metallurgical-grade silicon substrate is bonded onto the porous layer 103. With reference to FIG. 1D, a force is applied to the supporting substrate 104 or the porous layer 103 to cleave the porous layer 103 along the fragile portion. As a result, a porous layer 103a is transferred onto the supporting substrate 104. When the force is applied to the supporting substrate 104, another force may be applied to the silicon wafer 101. Alternatively, forces may be applied to both the supporting substrate 104 and the porous layer 103, or all the supporting substrate 104, the porous layer 103, and the silicon wafer 101. With reference to FIG. 1E, a single-crystal silicon layer 105 is formed by epitaxy on the transferred porous layer 103a, and an $n^+$ (or $n^+$) layer 106 is formed thereon. With reference to FIG. 1F, a surface electrode 107 is formed on the $n^+$ (or $n^+$) layer 106, an antireflective layer 108 is formed thereon, and a back electrode 109 is formed on another side, away from the porous layer, of the supporting substrate 104. A solar battery is thereby formed. With reference to FIG. 1G, a porous layer 103b remaining on the silicon wafer after the cleaving step is removed by etching or the like to regenerate the silicon wafer 101. The regenerated silicon wafer 101 is recycled to the first step shown in FIG. 1A.

Since the metallurgical-grade silicon substrate is used instead of a metal substrate in the present invention, incorporation of impurities into the epitaxial layer can be significantly suppressed in the deposition process. Moreover, the porous layer has gettering effects for impurities for the epitaxial layer. In addition, the porous layer is bonded to the supporting substrate and then is cleaved from the porous layer before epitaxial growth in the present invention. This method is advantageous in operation over a series of steps compared to a method for cleaving and handling only the porous layer before epitaxial growth.

A method for making solar batteries will be described with reference to the following embodiments using various types of silicon as materials for forming porous layers.

First Embodiment

A method for making a thin-film single-crystal solar battery on a metallurgical-grade silicon substrate will be described with reference to FIGS. 1A to 1G.

With reference to FIG. 1A, boron (B) is implanted into the surface layer of the silicon wafer 101 by thermal diffusion to form the $p^+$ layer 102. With reference to FIG. 1B, the single-crystal substrate provided with the surface $p^+$ layer 102 is anodized in the HF solution to form the porous layer 103. In this process, the anodization current may be set at a low level at the initial stage and then may be shifted to a higher level to form a gradient of porosity in the porous layer, whereby the porous layer can be cleaved at a desired portion.

Next, the metallurgical-grade silicon supporting substrate 104 is put into close contact with the porous layer 103 as shown in FIG. 1C, and the composite is heated in a furnace (not shown in the drawing) to bond the metallurgical-grade silicon supporting substrate 104 to the porous layer 103. The metallurgical-grade silicon substrate 104 is generally prepared as follows. A silicon ingot is prepared using a melt of metallurgical-grade silicon by a Czochralski process as in a general semiconductor wafer or a polycrystalline silicon ingot is prepared by a casting process from melted silicon. These ingots are sliced to form supporting substrates. As disclosed in Japanese Unexamined Patent Application Publication No. 9-36403, a sheet substrate may be directly formed by placing, melting, and then solidifying powdered metallurgical-grade silicon into a mold having a thin rectangular groove.

In a method for bonding the metallurgical-grade silicon supporting substrate 104 to the porous layer 103, these are put into close contact with each other and are annealed. Herein, it is preferable that a silicon oxide layer having a thickness as that of a native oxide or a trace amount of water be present on at least one of the surface of the metallurgical-grade silicon and the surface of the porous layer, in order to enhance the bonding strength therebetween. In another method for bonding the metallurgical-grade silicon substrate and the porous layer, a thin metal layer composed of Ni, Cr, Fe, Co, Ti, Mo, W, or the like is provided on a bonding surface of the metallurgical-grade silicon substrate or on a bonding surface of the porous layer by deposition or sputtering, the bonding surface of the metallurgical-grade silicon substrate and the bonding surface of the porous layer are put into close contact with each other and annealed to form a silicide layer. In these two methods, the porous layer 103 may be preliminarily annealed at 1,000° C. or more in a hydrogen atmosphere to planarize the surface of the porous layer. In a third method for bonding the metallurgical-grade silicon substrate to the porous layer, a metal layer having a low melting point, such as In, Sn, Ga, Bi, Al, or the like, is formed on one of a bonding surface of the metallurgical-grade silicon substrate or a bonding surface of the porous layer by evaporation or sputtering, and the both bonding surfaces are put into close contact with each other and are annealed. In this method, silicon was partially melted into the metal by heating and reprecipitated on the metallurgical-grade silicon substrate or the porous layer in the cooling step to partially bond the silicon substrate to the porous layer.

Among these, in bonding methods by providing metal layers, these metal layers also function as back reflective layers when optical devices, such as a solar battery, are formed on the porous layer.

With reference to FIG. 1D, a force is applied to the porous layer provided between the metallurgical-grade silicon substrate 104 and the single-crystal silicon substrate 101 to separate the porous layer 103a from the single-crystal silicon substrate 101. With reference to FIG. 1E, a single-crystal silicon layer 105 is deposited by a crystal growing process, such as a thermal CVD process or a liquid-phase epitaxial process on the cleaved porous layer 103a, until the thickness becomes adequate as an active layer of the solar battery. The applied force may be a pulling force, an unclenching force, ultrasonic waves, or a jet stream of liquid. A trace amount of dopant may be included when the single-crystal silicon layer 105 is formed in order to control the active layer to a p$^-$ type (or n$^-$type). An p$^+$ (or n$^+$) layer 106 is formed on the active layer 105 by thermal diffusion of a dopant, by a plasma-enhanced CVD process, or by increasing the amount of the dopant at the final stage of the formation of the active layer 105.

With reference to FIG. 1F, a grid collecting electrode 107 and an antireflective layer 108 are formed on the n$^+$ (or n$^+$) layer 106, and a back electrode 109 is formed on the back face of the metallurgical-grade silicon substrate 104 by vacuum deposition to complete the solar battery.

With reference to FIG. 1G, the porous layer 103b remaining on the single-crystal silicon substrate 101 after the cleaving step is removed by etching or the like. If the surface roughness is to great, the surface is planarized. The regenerated single-crystal silicon substrate 101 is recycled in the step shown in FIG. 1A.

Second Embodiment

In this embodiment, a thin-film polycrystalline solar battery is formed on a metallurgical-grade silicon substrate.

Figure 2A:
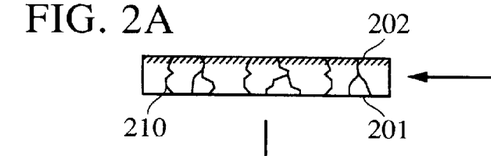
FIGS. 2A to 2G are schematic cross-sectional views illustrating another embodiment of a method for making a solar battery of the present invention.

With reference to FIG. 2A, boron (B) is implanted into the surface layer of a polysilicon substrate 201 by thermal diffusion. In the subsequent steps shown in FIGS. 2A to 2F, the thin-film polycrystalline solar battery is prepared as in the first embodiment, wherein numeral 202 represents a diffused layer doped with boron, numerals 203, 203a, and 203b represent porous layers, numeral 204 represents a metallurgical-grade silicon substrate, numeral 205 represents an active layer, numeral 206 represents an n$^+$ (or p$^+$ layer), numeral 207 represents a collecting electrode, numeral 208 represents an antireflective electrode (transparent electrode), and numeral 209 represents a back electrode.

Third Embodiment

In this embodiment, a thin-film compound semiconductor solar battery is formed on a metallurgical-grade silicon substrate.

Figure 3A:
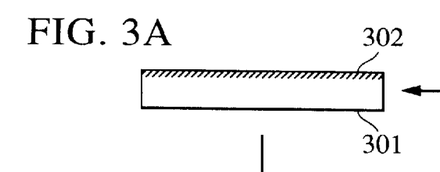
FIGS. 3A to 3G are schematic cross-sectional views illustrating another embodiment of a method for making a solar battery of the present invention.
Figure 3B:
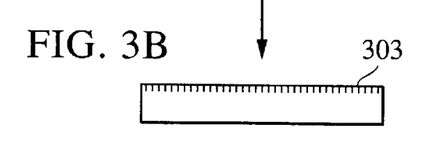

With reference to FIG. 3A, boron (B) is implanted into the surface layer of a single-crystal silicon substrate 301 by thermal diffusion to form a p$^+$ layer 302. With reference to FIG. 3B, the single-crystal substrate provided with the surface p$^+$ layer 302 is anodized in a HF solution by a gradient current mode in which the current is gradually increased from an initial low current after a predetermined time elapses, in order to form a porous layer 303.

Figure 3C:
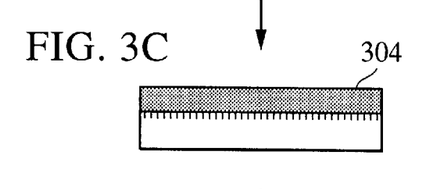

Next, a metallurgical-grade silicon supporting substrate 304 is put into close contact with the porous layer 303 as shown in FIG. 3C, and the composite is heated in a furnace (not shown in the drawing) as in the first embodiment to bond the metallurgical-grade silicon supporting substrate 304 to the porous layer 303.

Figure 3D:
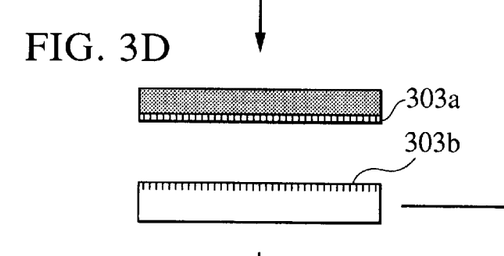

With reference to FIG. 3D, a force is applied to the porous layer provided between the metallurgical-grade silicon substrate 304 and the single-crystal silicon substrate 301 to separate a porous layer 303a from the single-crystal silicon substrate 301.

Figure 3E:
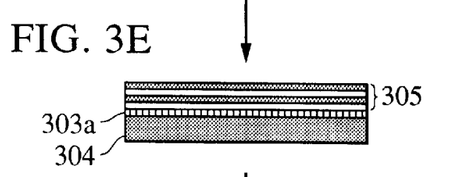

With reference to FIG. 3E, for example, a p$^+$ (or n$^+$ layer), a p$^-$ (or n$^-$) active layer, and an n$^+$ (or p$^+$ layer) are continuously deposited by a MOCVD process on the cleaved porous layer 303a. These layers constitute a compound semiconductor layer 305.

Figure 3F:
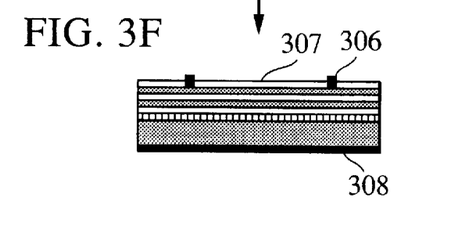

With reference to FIG. 3F, a grid collecting electrode 307 is formed on the compound semiconductor layer 305, an antireflective layer 307 is formed thereon, and a back electrode 309 is formed on the back face of the metallurgical-grade silicon substrate by vacuum deposition to complete the solar battery.

Figure 3G:
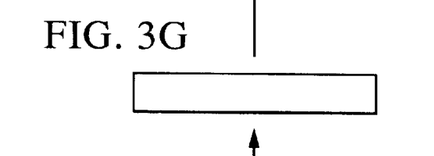

With reference to FIG. 3G, the porous layer 303b remaining on the single-crystal silicon substrate 301 after the cleaving step is removed as in the first embodiment. If the surface roughness is too great, the surface is planarized. The regenerated single-crystal silicon substrate 301 is recycled in the step shown in FIG. 3A.

As described above, the present invention relates to a method for forming a porous layer on a silicon substrate and then transferring the porous layer onto a supporting substrate, to a method for making a semiconductor layer prepared by depositing an epitaxial layer on the transferred porous layer, and to a method for making a thin-film crystalline solar battery.

The epitaxial layer deposited on the transferred porous layer has substantially the same characteristics as those of an epitaxial layer deposited on a wafer. Furthermore, this method allows the use of inexpensive substrates such as metallurgical-grade silicon. In addition, the silicon substrate used for forming the porous layer can be recycled. Thus, this method is advantageous in reducing material costs. Since a compound semiconductor layer can be formed on the transferred porous layer, this method is applicable to production of various semiconductor devices and solar batteries.

In the anodization process for forming the porous silicon layer of the present invention, a hydrofluoric acid (HF) solution is preferably used. The HF content in the solution is preferably 10% or more to facilitate pore formation. The current density during the anodization (anodization current density) is appropriately determined depending on the HF content, the target thickness of the porous layer, and the surface state of the porous layer, and is preferably in a range of 1 mA/cm$^2$ to 100 mA/cm$^2$.

Addition of alcohol, e.g., ethyl alcohol, to the HF solution facilitates instantaneous detachment of bubbles generated during the anodization process from the reacting surface without stirring and allows uniform production of the porous silicon layer effectively. The amount of the added alcohol is appropriately determined depending on the HF content, the target thickness of the porous layer, and the surface state of the porous layer, as long as the HF content is not noticeably decreased.

Examples of the epitaxial growing processes employed for forming the silicon layer on the porous layer include a thermal CVD process, a low pressure CVD (LPCVD) process, a sputtering process, a plasma-enhanced CVD process, and a photon-assisted CVD process. Examples of typical material gases used in a vapor phase epitaxial process, such as the thermal CVD process, the low pressure CVD (LPCVD) process, the plasma-enhanced CVD process, the photon-assisted CVD process, and the liquid-phase epitaxial process, include silanes and halogenated silanes, such as $SiH_2Cl_2$, $SiCl_4$, $SiHCl_3$, $SiH_4$, $Si_2H_6$, $SiH_2F_2$, and $Si_2F_6$.

In addition to the material gas, hydrogen ($H_2$) gas is also added as a carrier gas in order to form a reducing atmosphere for facilitating the crystal growth. The ratio, the material gas:hydrogen, is appropriately determined depending on the growing process, the type of the material gas, and the deposition conditions, and is in a range of preferably 1:10 to 1:1,000 by fed flow rate, and more preferably 1:20 to 1:800.

The liquid-phase epitaxial process is preferably performed by dissolving silicon into a solvent, such as Ga, In, Sb, Bi, or Sn and by slowly cooling the solution or providing a temperature gradient in the solution to epitaxially grow silicon.

In the formation of the compound semiconductor layer on the porous layer, a MOCVD process, a MBE process, or a liquid-phase epitaxial process is employed. Materials used in these crystal growing processes are appropriately determined depending on the type of the compound semiconductor to be formed and the deposition process. $Ga(CH_3)_3$, $ASH_3$, $Al(CH_3)_{31}$ and the like are used in the MOCVD process. As or As and Al are dissolved into Ga as a solvent in the liquid-phase epitaxial process.

The temperature and the pressure in the epitaxial process used in the present invention are determined dependent on the type of the epitaxial process and the type of the material gas. The temperature is set at preferably 800° C. to 1,250° C. and more preferably 850 to 1,200° C. when silicon is deposited by a general thermal CVD process. The preferable temperature range varies with the type of the solvent in the liquid-phase epitaxial process. For example, the temperature is preferably set at 600° C. to 1,050° C. when silicon is deposited using Sn or In as a solvent. The temperature is preferably set at 650° C. to 850° C. when GaAs is deposited using Ga as a solvent. The temperature is preferably set at 650° C. to 900° C. when GaAs is deposited by a MOCVD process. Moreover, the temperature is set at preferably 200° C. to 600° C. and more preferably 200° C. to 500° C. in a low-temperature process such as a plasma-enhanced CVD process.

The pressure is in a range of preferably 1 Pa to $10^5$ Pa and more preferably 10 Pa to $10^5$ Pa in a process other than the MBE process. In the MBE process, the evacuation pressure is preferably $10^{-3}$ Pa or less and more preferably $10^{-4}$ Pa or less.

In the solar battery of the present invention, the surface of the semiconductor layer may be subjected to a texturing treatment to reduce reflective loss of the incident light. The texturing is performed using hydrazine, NaOH, or KOH. The height of the textured pyramid is preferably in a range of 1 $\mu$m to 100 $\mu$m.

The formation of preferable solar batteries by the method of the present invention will now be described in more detail with reference to the following non-limiting EXAMPLES.

EXAMPLE 1

A thin-film single-crystal solar battery was formed on a metallurgical-grade silicon substrate by a process shown in FIG. 1.

A p$^+$ layer 102 with a thickness of approximately 3 $\mu$m as a diffused layer was formed on a surface of a single-crystal silicon wafer 101 with a thickness of 600 $\mu$m by thermal diffusion of boron at 1,200° C. using a $BCl_3$ thermal diffusion source (FIG. 1A). A porous silicon layer 103 was formed on the wafer by anodization in a HF solution under the conditions shown in Table 1 (FIG. 1B). Anodization was performed at a low current density of 5 mA/cm$^2$ for 2.5 minutes at an initial stage, the current density was gradually increased for 30 seconds, and the anodization was completed when the current density reached 30 mA/cm$^2$.

TABLE 1

| Anodization Solution | $HF:H_2O:C_2H_5OH$ = 1:1:1 |
|---|---|
| Current Density | 5 mA/cm$^2$ → 30 mA/cm$^2$ |
| Anodization Time | 2.5 min → (30 sec) → 0 sec |

An ingot was pulled up using 98% metallurgical-grade silicon by a Czochralski (CZ) method and was sliced into wafers having a thickness of 0.5 mm. The wafer was mirror-polished to prepare a metallurgical-grade silicon substrate 104. Table 2 shows the results of an elemental analysis on the surface of the resulting metallurgical-grade silicon substrate 104 as a supporting substrate. The crystal grain size of the metallurgical-grade silicon substrate was several millimeters to several centimeters, and the resistivity was 0.05 Ω·cm (p-type).

TABLE 2

| Impurities | Content |
|---|---|
| B | 8 ppm |
| Al | 2 ppm |
| Ni | <5 ppm |
| Fe | 1 ppm |
| Cr | 0.6 ppm |
| Mn | <0.2 ppm |
| Ti | <1 ppm |

After a small amount of water was applied to a bonding surface of the metallurgical-grade silicon substrate 104, the bonding surface of the metallurgical-grade silicon substrate 104 was put into close contact with the porous layer 103, and the composite was heated in a furnace (not shown in the drawing) to bond the metallurgical-grade silicon substrate 104 to the porous layer 103 (FIG. 1C).

A sharp edged tool (not shown in the drawing) was inserted into the porous layer 103 between the metallurgical-grade silicon substrate 104 and the single-crystal silicon wafer 101 to cleave a porous layer 103a from the single-crystal silicon wafer 101 by a force applied to the tool (FIG. 1D).

A single-crystal silicon layer 105 with a thickness of 30 μm was formed on the cleaved porous layer 103a by epitaxy under the conditions shown in Table 3 using a conventional thermal CVD system.

TABLE 3

| Ratio of Gas Flow Rate | $SiH_2Cl_2/H_2$ = 0.5/100 (liter/min) |
|---|---|
| Substrate Temperature | 1,050° C. |
| Pressure | Atmospheric Pressure |
| Deposition Time | 30 min |

In this growing step, a trace amount (in the order of 0.1 ppm to several ppm) of $B_2H_6$ was added so that the deposited silicon layer became a p⁻ type, and in the final stage of the growing step, the gas was changed to $PH_3$ (several ppm) so as to form an n⁺ layer 106 (FIG. 1E).

According to the cross-section observation by transmittance electron microscopy, no more crystal defects were introduced, and high crystallinity was still maintained in these silicon layers 105 and 106.

Finally, a collecting electrode 107 of Ti/Pd/Ag (400 nm/200 nm/1 μm) and then an ITO transparent conductive film 108 with a thickness of 82 nm were deposited on the n⁺ layer 106 by an electron beam deposition process. An aluminum back electrode with a thickness of 2 μm was formed on the back face of the metallurgical-grade silicon substrate 104 to complete the solar battery (FIG. 1F).

The I—V characteristics of the single-crystal silicon solar battery formed on the metallurgical-grade silicon substrate which was irradiated with light of AM 1.5 (100 mW/cm²) were measured. In the cell area of 6 cm², the open-circuit voltage was 0.59 V, the short-circuit photocurrent density was 33 mA/cm², the fill factor was 0.79, and the photoelectric conversion efficiency was 15.4%.

The silicon wafer 101 after cleaving having the residual porous layer 103b was immersed into a mixed solution containing hydrofluoric acid, hydrogen peroxide, and deionized water with stirring for selective etching. Most of the nonporous portion of the wafer 101 remained while the porous layer was completely etched (FIG. 1G).

The etching rate of the nonporous single-crystal silicon is extremely low in the above etching solution, and the selective etching ratio of the porous layer to the nonporous single-crystal silicon is as high as the order of $10^5$. Accordingly, a decrease in thickness of the nonporous single-crystal silicon layer during the etching is several nm which is a negligible level in practical use.

The above steps were repeated several times using the resulting recycled wafer, and several thin-film single-crystal solar batteries having high-quality semiconductor layers were prepared.

EXAMPLE 2

A thin-film polycrystalline solar battery was formed on a metallurgical-grade silicon substrate by a process shown in FIG. 2.

Figure 2B:
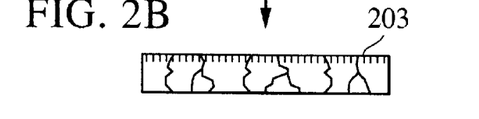

A p⁺ layer 202 with a thickness of approximately 3 m as a diffused layer was formed on a surface of a cast silicon (polycrystalline silicon) wafer 201 with a thickness of 1 mm by thermal diffusion of boron at 1,200° C. using a $BCl_3$ thermal diffusion source (FIG. 2A). A porous silicon layer 203 was formed on the polycrystalline silicon wafer 201 by anodization in a HF solution under the conditions shown in Table 4 (FIG. 2B). Anodization was performed at a low current density of 5 mA/cm² for 2.5 minutes, and the current density was abruptly increased to 100 mA/cm² and was maintained at this current density for 8 seconds.

TABLE 4

| Anodization Solution | $HF:H_2O:C_2H_5OH$ = 1:1:1 |
|---|---|
| Current Density | 5 mA/cm² → 100 mA/cm² |
| Anodization Time | 2.5 min → 8 sec |

Figure 2C:
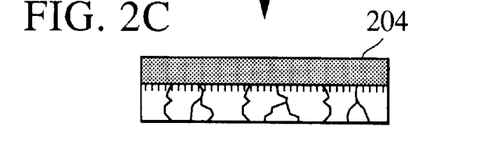

After a Ni layer (not shown in the drawing) with a thickness of 50 nm was deposited on a bonding surface of a metallurgical-grade silicon substrate 204 by a deposition process, the bonding surface of the metallurgical-grade silicon substrate 204 was put into close contact with the porous layer 203, and the composite was heated in a furnace (not shown in the drawing) to bond the metallurgical-grade silicon substrate 204 to the porous layer 203, as in Example 1 (FIG. 2C). In this case, a silicide layer (not shown in the drawing) was formed between the metallurgical-grade silicon substrate 204 and the porous layer 203.

Figure 2D:
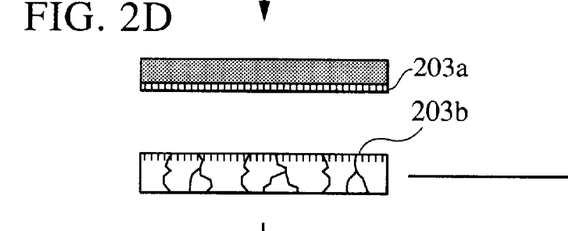

A pulling force was applied to the porous layer 203 between the metallurgical-grade silicon substrate 204 and the polycrystalline silicon wafer 201 to separate a porous layer 203 from the polycrystalline silicon wafer 201 (FIG. 2D).

Figure 2E:
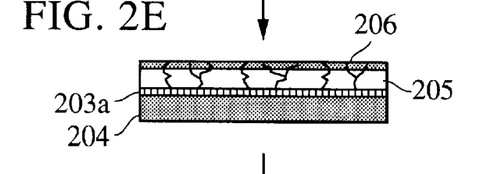

A polycrystalline silicon layer 205 with a thickness of 30 μm was formed on the porous silicon layer 203a by an epitaxial process using a slider-type liquid-phase deposition system using indium as a solvent under the conditions shown in Table 5. In this process, a trace amount of B (in the order of 0.1 ppm to several ppm to the amount of the dissolved silicon) was added so that the deposited silicon layer 205 was a p⁻ type, and an n⁺ type layer 206 with a thickness of 200 nm was formed on the deposited silicon layer 205 using another In melt containing phosphorus (several thousands ppm to the amount of the dissolved silicon) (FIG. 2E).

TABLE 5

| $H_2$ Flow Rate | 5 liter/min |
|---|---|
| Solvent (In) Temperature | 950° C. → 830° C. |
| Cooling Rate | 1° C./min |

According to the cross-section observation by transmittance electron microscopy, no more crystal defects were introduced, and high crystallinity was still maintained in these silicon layers 205 and 206.

Figure 2F:
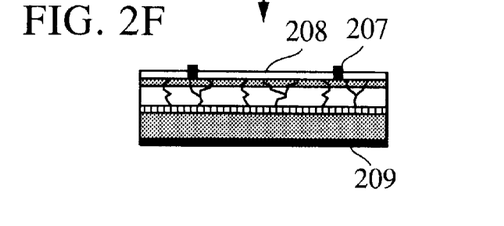

Finally, a collecting electrode 207 of Ti/Pd/Ag (400 nm/200 nm/1 μm) and then an ITO transparent conductive film 208 with a thickness of 82 nm were deposited on the n⁺ layer 206 by an electron beam deposition process. An aluminum back electrode with a thickness of 2 μm was formed on the back face of the metallurgical-grade silicon substrate 204 to complete the solar battery (FIG. 2F).

The I—V characteristics of the polycrystalline silicon solar battery formed on the metallurgical-grade silicon substrate which was irradiated with light of AM 1.5 (100 mW/cm²) were measured. In the cell area of 6 cm², the open-circuit voltage was 0.58 V, the short-circuit photocurrent density was 32.5 mA/cm², the fill factor was 0.76, and the photoelectric conversion efficiency was 14.3%.

Figure 2G:
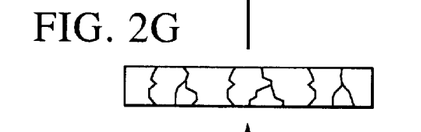

The silicon wafer 201 after cleaving having the residual porous layer 203b was immersed into an organic alkaline solution containing tetramethylammonium hydroxide (TMAH) with stirring to remove the residual porous layer 203b by selective etching (FIG. 2G).

The above steps were repeated several times using the resulting recycled wafer, and several thin-film polycrystalline solar batteries having high-quality semiconductor layers were prepared.

EXAMPLE 3

A thin-film compound semiconductor solar battery was formed on a metallurgical-grade silicon substrate by a process shown in FIG. 3.

A p$^+$ layer 302 with a thickness of approximately 3 $\mu$m as a diffused layer was formed on a surface of a single-crystal silicon wafer 301 with a thickness of 500 $\mu$m by thermal diffusion of boron at 1,200° C. using a BCl$_3$ thermal diffusion source (FIG. 3A). A porous silicon layer 303 was formed on the single-crystal silicon wafer 301 by anodization in a HF solution under the conditions shown in Table 6 (FIG. 3B). Anodization was performed at a low current density of 1 mA/cm$^2$ for 2 minutes and then at another low current density of 5 mA/cm$^2$ for 2.5 minutes, the current density was gradually increased for 20 seconds, and the anodization was completed when the current density reached 40 mA/cm$^2$.

After an indium layer with a thickness of 1,000 nm (not shown in the drawing) was deposited on a bonding surface of a metallurgical-grade silicon substrate 304 by a deposition process, the bonding surface of the metallurgical-grade silicon substrate 304 was put into close contact with the porous layer 303, and the composite was heated in a furnace (not shown in the drawing) to bond the metallurgical-grade silicon substrate 304 to the porous layer 303, as in Examples 1 and 2 (FIG. 3C). In this case, silicon was partially melted into indium by heating and reprecipitated on the metallurgical-grade silicon substrate or the porous layer in the cooling step to partially bond the silicon substrate to the porous layer.

The composite was placed into a water bath and ultrasonic waves were applied to the composite to cleave the porous layer 303 between the metallurgical-grade silicon substrate 304 and the single-crystal silicon wafer 301 and to form a porous layer 303a on the metallurgical-grade silicon substrate 304 (FIG. 3D).

TABLE 6

| Anodization Solution | HF:H$_2$O:C$_2$H$_5$OH = 1:1:1 |
|---|---|
| Current Density | 1 mA/cm$^2$ → 5 mA/cm$^2$ → 40 mA/cm$^2$ |
| Anodization Time | 2 min → 2.5 min → (20 sec) → 0 sec |

Figure 4:
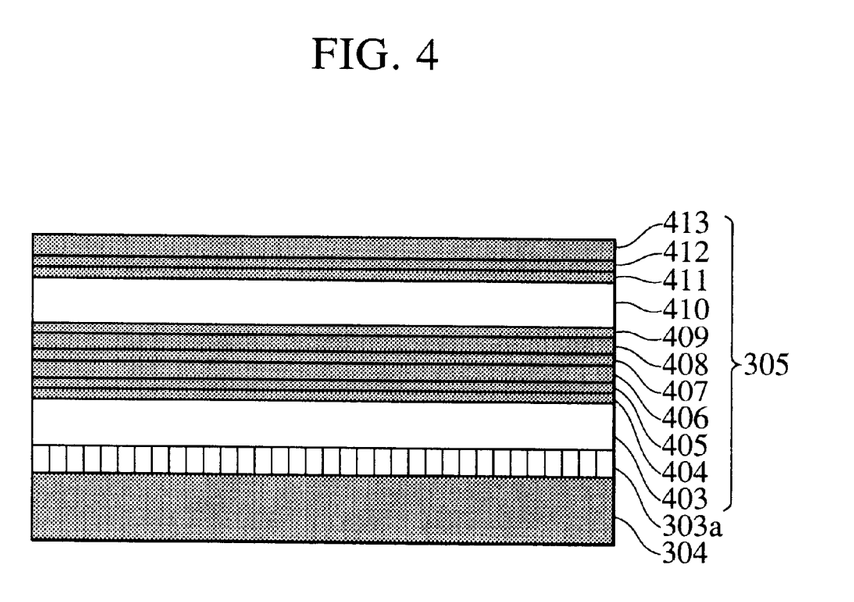
FIG. 4 is a schematic cross-sectional view of a thin-film GaAs/AlGaAs solar battery formed on a porous layer by the method shown in FIGS. 3A to 3G.

After the surface of the porous silicon layer 303a was annealed at 1,050° C. for 7 minutes in a hydrogen atmosphere, a tandem-type (single crystal) GaAs/AlGaAs layer 305 shown in FIG. 4 was deposited using a metal-organic chemical vapor deposition (MOCVD) system (FIG. 3E). In FIG. 4, numeral 403 represents a p-GaAs layer, numeral 404 represents an n-GaAs layer, numeral 405 represents an n$^+$ Al$_{0.9}$Ga$_{0.1}$As layer, numeral 407 numeral 406 represents an n-Al$_{0.37}$Ga$_{0.63}$As layer, numeral 407 represents an n$^+$-Al$_x$Ga$_{1-x}$As layer, numeral 408 represents a p-Al$_{0.37}$Ga$_{0.63}$As layer, numeral 409 represents a p$^+$-Al$_x$Ga$_{1-x}$As layer, numeral 410 represents a p-Al$_{0.37}$Ga$_{0.63}$As layer, numeral 411 represents an n-Al$_{0.37}$Ga$_{0.63}$As layer, numeral 412 represents an n$^+$-Al$_x$Ga$_{1-x}$As layer, and numeral 413 represents an n$^+$-GaAs layer. According to the cross-sectional observation by transmittance electron microscopy, no more crystal defects were introduced, and high crystallinity was still maintained in the GaAs/AlGaAs layer 305.

The uppermost layer of the resulting GaAs/AlGaAs layer 305 was etched to form a grid of the n$^+$-GaAs layer 413 and to expose the n$^+$-Al$_x$Ga$_{1-x}$As layer 412, and a (Au/Ge/Ni/Au) surface electrode 306 was formed only on the grid of the n$^+$-GaAs layer 413 by an electron beam (EB) deposition process and a photolithographic process. A TiO$_2$/MgO anti-reflective layer 307 was deposited by a plasma-enhanced CVD process, and an aluminum back electrode 308 with a thickness of 2 $\mu$m was deposited by evaporation on the back surface of the metallurgical-grade silicon substrate to complete the solar battery (FIG. 3F).

The I—V characteristics of the resulting silicon solar battery was irradiated with light of AM 1.5 (100 mW/cm$^2$) were measured. In the cell area of 4 cm$^2$, the open-circuit voltage was 2.3 V, the short-circuit photocurrent density was 13.2 mA/cm$^2$, the fill factor was 0.80, and the photoelectric conversion efficiency was 24.3%.

The residual porous layer 303b was removed from the silicon wafer after cleaving by etching as in Example 1 or 2 to form a smooth surface on the silicon wafer. The above steps were repeated several times using the resulting recycled wafer, and several thin-film compound semiconductor solar batteries having high-quality semiconductor layers were prepared.

The present invention is not limited to the above EXAMPLES and may include a variety of modifications. For example, a porous layer is formed on one side (first side) of a substrate. Instead, another porous layer may be formed on the other side (second side) of the substrate by reversing the direction of the current in the anodization step after the porous layer is formed on the first side. The subsequent steps may be repeated for the sides so that twice the number of crystal solar batteries are produced at the same time.

In the present invention, the supporting substrate may be a graphite or carbon substrate instead of the above metallurgical-grade silicon substrate.

According to the present invention, a SOI wafer can also be produced by transferring a porous layer on an insulating substrate of, for example, mulite (3Al$_2$O$_3$–2SiO$_2$) instead of the metallurgical-grade silicon.

According to the present invention, the method for transferring the porous layer provides a semiconductor layer having satisfactory characteristics. By employing this method in the production of a semiconductor device or a solar battery, a high-quality epitaxial layer can be formed on an inexpensive substrate such as a metallurgical-grade silicon substrate. Moreover, by recycling the silicon substrate for the formation of the porous layer, the semiconductor devices and thin-film crystalline solar batteries having high performance can be produced at low costs.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A method for transferring a porous layer comprising:
   forming a porous layer on one side of a crystalline silicon member by anodization;

fixing a supporting substrate onto the surface of the porous layer; said supporting substrate comprising metallurgical-grade silicon; and applying force to at least the supporting substrate or the porous layer, whereby at least part of the porous layer is cleaved from the crystalline silicon member and is transferred onto the supporting substrate.

2. A method for transferring a porous layer according to claim 1, wherein the crystalline silicon member is a silicon wafer.

3. A method for transferring a porous layer according to claim 2, wherein the silicon wafer is a single-crystal silicon wafer.

4. A method for transferring a porous layer according to claim 2, wherein the silicon wafer is a polycrystalline silicon wafer.

5. A method for transferring a porous layer according to claim 1, wherein the force is applied by inserting a blade into the porous layer.

6. A method for transferring a porous layer according to claim 1, wherein the force is a pull strength applied between the crystalline silicon member and the supporting substrate.

7. A method for transferring a porous layer according to claim 1, wherein the force is applied by providing ultrasonic waves to the porous layer.

8. A method for transferring a porous layer according to claim 1, wherein a first porous sublayer and a second porous sublayer are formed in that order, to comprise the porous layer.

9. A method for transferring a porous layer according to claim 9, wherein the first porous sublayer and the second porous sublayer are formed under different anodization conditions.

10. A method for transferring a porous layer according to claim 9, wherein the anodization current when the first porous sublayer is formed is different from the anodization current when the second porous sublayer is formed.

11. A method for transferring a porous layer according to claim 8, wherein the porous layer is cleaved at the interface between the first porous sublayer and the second porous sublayer.

12. A method for transferring a porous layer according to claim 8, wherein the porous layer is cleaved in the first porous sublayer.

13. A method for transferring a porous layer according to claim 9, wherein the porous layer is cleaved in the second porous sublayer.

14. A method for making a semiconductor device comprising:

forming a porous layer on one side of a crystalline silicon member by anodization;

fixing a supporting substrate onto the surface of the porous layer;

applying force to at least the supporting substrate or the porous layer, whereby at least part of the porous layer is cleaved from the crystalline silicon member and is transferred onto the supporting substrate; and forming a crystalline semiconductor layer onto the transferred porous layer.

15. A method for making a semiconductor device according to claim 14, wherein the crystalline semiconductor layer is formed by epitaxial growth.

16. A method for making a semiconductor device according to claim 14, further comprising a step of forming a semiconductor junction in the crystalline semiconductor layer.

17. A method for making a semiconductor device according to claim 14, wherein the crystalline semiconductor layer comprises silicon.

18. A method for making a semiconductor device according to claim 14, wherein the crystalline semiconductor layer comprises a compound semiconductor.

19. A method for making a semiconductor device according to any one of claims 14 to 18, further comprising a step of forming another porous layer by anodization onto the crystalline semiconductor layer after the prior porous layer is transferred.

20. A method for making a semiconductor device according to claim 19, wherein the other porous layer is transferred onto another supporting substrate which is different from the prior supporting substrate.

21. A method for making a solar battery comprising: forming a porous layer on one side of a crystalline silicon member by anodization;

fixing a supporting substrate onto the surface of the porous layer;

applying force to at least the supporting substrate or the porous layer, whereby at least part of the porous layer is cleaved from the crystalline silicon member and is transferred onto the supporting substrate; and forming a crystalline semiconductor layer onto the transferred porous layer.

* * * * *

UNITED STATES PATENT AND TRADEMARK OFFICE
CERTIFICATE OF CORRECTION

PATENT NO.    : 6,602,767 B2
DATED         : August 5, 2003
INVENTOR(S)   : Shoji Nishida et al.

It is certified that error appears in the above-identified patent and that said Letters Patent is hereby corrected as shown below:

Column 4,
Lines 4 and 6, "(or $n^+$)" should read -- (or p+) --.

Column 5,
Line 47, "the $n^+$" should read -- the p+ --.

Column 7,
Line 46, "$Al(CH_3)_{31}$" should read -- $Al(CH_3)_3$, --.

Column 12,
Line 41, "$(3Al_2O_{3-2}SiO_2)$" should read -- $(3Al_2O_3-2SiO_2)$ --.

Column 13,
Line 31, "claim 9," should read -- claim 8, --.

Signed and Sealed this

Twenty-third Day of March, 2004

JON W. DUDAS
*Acting Director of the United States Patent and Trademark Office*